United States Patent
Lipson et al.

(10) Patent No.: US 8,027,026 B2
(45) Date of Patent: *Sep. 27, 2011

(54) LITHOGRAPHIC APPARATUS AND DEVICE MANUFACTURING METHOD

(75) Inventors: Matthew Lipson, Stamford, CT (US); Marcel Mathijs Theodore Marie Dierichs, Venlo (NL); Sjoerd Nicolaas Lambertus Donders, 's-Hertogenbosch (NL); Johannes Catharinus Hubertus Mulkens, Waalre (NL); Bob Streefkerk, Tilburg (NL); Ronald Wilklow, Fairfield, CT (US); Roel De Jonge, Veldhoven (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/016,211

(22) Filed: Jan. 28, 2011

(65) Prior Publication Data

US 2011/0134402 A1 Jun. 9, 2011

Related U.S. Application Data

(63) Continuation of application No. 10/957,751, filed on Oct. 5, 2004, now Pat. No. 7,894,040.

(51) Int. Cl.
*G03B 27/54* (2006.01)
(52) U.S. Cl. ........... 355/67; 355/30; 355/44; 355/72; 355/53; 355/18; 355/73
(58) Field of Classification Search ............ None
See application file for complete search history.

(56) References Cited

U.S. PATENT DOCUMENTS

| 3,573,975 | A | 4/1971 | Dhaka et al. | 117/212 |
|---|---|---|---|---|
| 3,648,587 | A | 3/1972 | Stevens | 95/44 |
| 4,090,263 | A | 5/1978 | Hoffa | |
| 4,346,164 | A | 8/1982 | Tabarelli et al. | 430/311 |
| 4,390,273 | A | 6/1983 | Loebach et al. | 355/125 |
| 4,396,705 | A | 8/1983 | Akeyama et al. | 430/326 |
| 4,480,910 | A | 11/1984 | Takanashi et al. | 355/30 |
| 4,509,852 | A | 4/1985 | Tabarelli et al. | 355/30 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando Jan. 2001, Dec. 17, 2001.

(Continued)

*Primary Examiner* — Dah-Wei D Yuan
*Assistant Examiner* — Robert S Walters, Jr.
(74) *Attorney, Agent, or Firm* — Pillsbury Winthrop Shaw Pittman LLP

(57) ABSTRACT

A method including mixing using a mixer a first component and a second component to form a liquid before supply to a space between the projection system and a substrate, measuring a property of the liquid using a measuring device and making the feedback available to a controller, based on the feedback, controlling with the controller a physical property of the liquid by controlling the amount of the first and/or second component used to form the liquid, supplying the liquid to the space between the projection system and the substrate, and projecting a patterned beam of radiation, using the projection system, through the liquid onto a target portion of the substrate.

20 Claims, 3 Drawing Sheets

U.S. PATENT DOCUMENTS

| | | | | |
|---|---|---|---|---|
| 4,976,137 | A * | 12/1990 | Decker et al. | 324/439 |
| 5,040,020 | A | 8/1991 | Rauschenbach et al. | 355/53 |
| 5,610,683 | A | 3/1997 | Takahashi | 355/53 |
| 5,715,039 | A | 2/1998 | Fukuda et al. | 355/53 |
| 5,825,043 | A | 10/1998 | Suwa | 250/548 |
| 5,900,354 | A | 5/1999 | Batchelder | 430/395 |
| 6,010,032 | A | 1/2000 | Vermylen et al. | |
| 6,191,429 | B1 | 2/2001 | Suwa | 250/548 |
| 6,236,634 | B1 | 5/2001 | Lee et al. | 369/112 |
| 6,560,032 | B2 | 5/2003 | Hatano | 359/656 |
| 6,595,944 | B2 | 7/2003 | Balschat et al. | |
| 6,600,547 | B2 | 7/2003 | Watson et al. | |
| 6,603,130 | B1 | 8/2003 | Bisschops et al. | 250/492.1 |
| 6,633,365 | B2 | 10/2003 | Suenaga | 355/53 |
| 6,954,256 | B2 | 10/2005 | Flagello et al. | |
| 7,394,521 | B2 | 7/2008 | Van Santen et al. | |
| 7,545,481 | B2 | 6/2009 | Streefkerk et al. | |
| 7,589,818 | B2 | 9/2009 | Mulkens et al. | |
| 7,804,574 | B2 | 9/2010 | Streefkerk et al. | |
| 7,894,040 | B2 * | 2/2011 | Lipson et al. | 355/67 |
| 2002/0020821 | A1 | 2/2002 | Van Santen et al. | 250/492 |
| 2002/0163629 | A1 | 11/2002 | Switkes et al. | 355/53 |
| 2003/0123040 | A1 | 7/2003 | Almogy | 355/69 |
| 2003/0174408 | A1 | 9/2003 | Rostalski et al. | 359/642 |
| 2004/0000627 | A1 | 1/2004 | Schuster | |
| 2004/0021844 | A1 | 2/2004 | Suenaga | |
| 2004/0055955 | A1 | 3/2004 | Davis | |
| 2004/0075895 | A1 | 4/2004 | Lin | 359/380 |
| 2004/0109237 | A1 | 6/2004 | Epple et al. | |
| 2004/0114117 | A1 | 6/2004 | Bleeker | |
| 2004/0119954 | A1 | 6/2004 | Kawashima et al. | 355/30 |
| 2004/0125351 | A1 | 7/2004 | Krautschik | 355/53 |
| 2004/0135099 | A1 | 7/2004 | Simon et al. | |
| 2004/0136494 | A1 | 7/2004 | Lof et al. | |
| 2004/0160582 | A1 | 8/2004 | Lof et al. | |
| 2004/0165159 | A1 | 8/2004 | Lof et al. | |
| 2004/0207824 | A1 | 10/2004 | Lof et al. | |
| 2004/0211920 | A1 | 10/2004 | Derksen et al. | |
| 2005/0036183 | A1 | 2/2005 | Yeo et al. | |
| 2005/0161644 | A1 | 7/2005 | Zhang et al. | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | 03/087259 | 10/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | 2005/074606 | 8/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions" May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac, Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial λ/NA scaling equations for resolution, depth of focus, and immersion lithography, *J. Microlith., Microfab., Microsyst.* 1(1):7-12 (2002).

English Translation of Japanese Official Action issued on Dec. 4, 2008 in Japanese Application No. 2005-290623.

* cited by examiner

LITHOGRAPHIC APPARATUS AND DEVICE MANUFACTURING METHOD

This application is a continuation of U.S. patent application Ser. No. 10/957,751, filed Oct. 5, 2004, now being U.S. Pat. No. 7,894,040, which is incorporated herein its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having, a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In an immersion lithography, a prime candidate liquid is water as it has a relatively high refractive index (1.4). However, for optimal use, an even higher refractive index is desired, typically about 1.6. To increase the refractive index of water, alkali sulfate salts may be included in the immersion liquid. While this improves the refractive index properties of the immersion liquid, the transmissivity of the liquid may be significantly reduced as sulfate salts have a strong optical absorbance at 193 nm, a common wavelength for lithography. Furthermore, the cost of such an immersion liquid may be high.

Further, the addition of solutes or other particles to, a liquid for immersion lithography may lead to the possibility of agglomeration of particles, or formation of other inhomogeneities in the liquid. Such inhomogeneity may lead to local scattering of the projection beam and thus to potential faults in the imaged pattern.

In a typical immersion lithography system, the last optic in the projection system is immersed in the immersion liquid. A material that may be used to make this optic is calcium fluoride ($CaF_2$). However, $CaF_2$ dissolves slowly in water, a liquid which is likely to be used as an immersion liquid. Replacement of such an optic may therefore be required more frequently than desired.

Accordingly, it would be advantageous, for example, to provide a lithographic apparatus which, during operation, comprises an immersion liquid having a refractive index higher than that of water and which addresses one or more of the problems discussed above.

According to an aspect of the invention, there is provided a lithographic apparatus, comprising:

an illumination system configured to condition a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate; and a liquid supply system configured to fill a space between the projection system and the substrate with a liquid, the liquid comprising an aqueous solution of one or more alkali metal halides.

The immersion liquid used in the apparatus comprises an aqueous solution of one or more alkali metal halides. Alkali metal halides (alkali halides) typically have high refractive indices and inclusion of one or more alkali halides in the immersion liquid may therefore increase the refractive index of the liquid. By adjusting the nature and concentration of the alkali halide(s) used, the refractive index of the liquid can be manipulated such that it is at, or close to, the optimal value of 1.6.

The alkali halide family have a variety of different optical absorption patterns. The alkali halide(s) may therefore be selected so as to have a low optical absorption at the wavelength of the projection beam to be used. Thus, a high transmissivity of the projection beam may be maintained. Further, alkali halides are highly soluble in water and even distribution of the salt throughout the solution may therefore easily be achieved. This may help to avoid scattering of the projection beam.

In an embodiment of the invention, the alkali metal halide is an alkali metal fluoride, in particular sodium or cesium fluoride. The presence of fluoride salts in the immersion liquid may reduce the solubility of a $CaF_2$ optic in the liquid. Thus, the degradation of a $CaF_2$ component immersed in the immersion liquid may be reduced and its lifetime extended. Sodium and cesium fluoride have an advantage of high solubility in water and low optical adsorption at crucial wavelengths, such as 193 nm. Thus, the use of these materials may provide high transmission of the projection beam while also improving the lifetime of one or more immersed components.

According to a further aspect, there is provided a lithographic apparatus, comprising:

an illumination system configured to condition a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate; and a liquid supply system configured to fill a space between the projection system and the substrate with a liquid, the liquid supply system comprising a mixer configured to mixing a first component with a second component to form the liquid.

In an embodiment of the invention, the first component is a solvent and the second component is a concentrate so that the mixing step forms a solution. The mixing of the solution may avoid or reduce agglomeration of particles to ensure a homogenous liquid. In an embodiment, the solution is continuously mixed in a fluid chamber in part of the liquid supply system. The mixer in such a chamber or elsewhere may be by use of a magnet or a mechanical stirrer.

Different solution refractive indices will affect the optical path length of the projection beam so the concentration of the solution could be used as an additional projection system adjustment parameter. To achieve this, a measurer configured to measure the concentration of the solution and a controller configured to control the amount of, concentrate used are provided.

In an embodiment, the amount of the first and/or second components, as well as optional further components, may be controlled or adjusted in order to control or adjust one or more physical properties of the liquid. For example, the liquid may comprise two or more different concentrates as well as a solvent, the amounts of one or more of the concentrates being adjustable. This embodiment might involve using a measuring device to measure a property of the liquid (e.g. concentration, viscosity and/or refractive index) and using a controller to control the amount(s) of one or more of the components in the liquid in order to control the physical property. The controller may be automatic or manually operated by the user. The user may tune the physical property(ies) of the liquid to optimize the behavior of the lithographic apparatus. For example, tuning the viscosity may optimize the physical and dynamical fluid behavior of the liquid, in turn potentially reducing bubbling, vibrational coupling, friction and/or heat dissipation. Tuning the refractive index may optimize imaging for a particular chosen application, or it may minimize radiation loss or depolarization due to refractive index transitions. The user may control the physical property(ies) of the liquid by making any necessary adjustments to the liquid composition between exposures. The tuning features may be provided to the user through a software program. Additionally or alternatively, the software program may be configured to perform all or some of the tuning automatically without user invention based on appropriate algorithms.

The concentrate(s) used may comprise alkali halide, or any other dissolving mineral salt or dissolvable organic material. As such concentrate(s) may be expensive, it may be desirable to reuse the concentrate(s) so the liquid supply system may comprise a concentrate separator which separates the concentrate(s) from the solvent. The concentrate(s) could then be reused and the solvent, together with any impurities, removed.

According to a further aspect of the invention, there is provided a device manufacturing method, comprising:

providing a liquid comprising an aqueous solution of an alkali metal halide to a space between a projection system and a substrate; and projecting a patterned beam of radiation, using the projection system, through the liquid onto a target portion of the substrate.

According to a further aspect of the invention, there is provided a device manufacturing method, comprising:

continuously mixing a first component and a second component to form a liquid;

providing the liquid to a space between a projection system and a substrate; and projecting a patterned beam of radiation, using the projection system, through the liquid onto a target portion of the substrate.

The first and second components are, for example, a solvent and a concentrate. Further, the method may comprise controlling a physical property of the liquid by controlling an amount of the first component, the second component, or both used to form the liquid.

According to a further aspect of the invention there is provided an aqueous solution of one or more alkali metal halides, the solution having one or more of the following properties (a) a content of organic compounds of 5 ppb or less;
(b) a particle content of no more than 2 particles having a dimension of 50 nm or greater per ml of the solution;
(c) a dissolved oxygen concentration of 15 ppb or less; and
(d) a silica content of 500 ppt or less.

According to a further aspect, there is provided the use of one or more alkali metal halides as an agent to increase the refractive index of a liquid which is water or an aqueous solution, wherein the liquid fills a space between a projection system and a substrate in a lithographic apparatus when in operation.

According to a yet further aspect of the invention there is provided the use of an alkali metal fluoride as an agent to reduce degradation of a $CaF_2$ part in a liquid, wherein the liquid fills a space between a projection system and a substrate in a lithographic apparatus when in operation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used, herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation.

The lithographic apparatus may be of a type having two (dual stage) or more substrate tables (and/or two or more mask tables). In such "multiple stage" machines the additional tables may be used in parallel, or preparatory steps may be carried out, on one or more tables while one or more other tables are being used for exposure.

BRIEF. DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
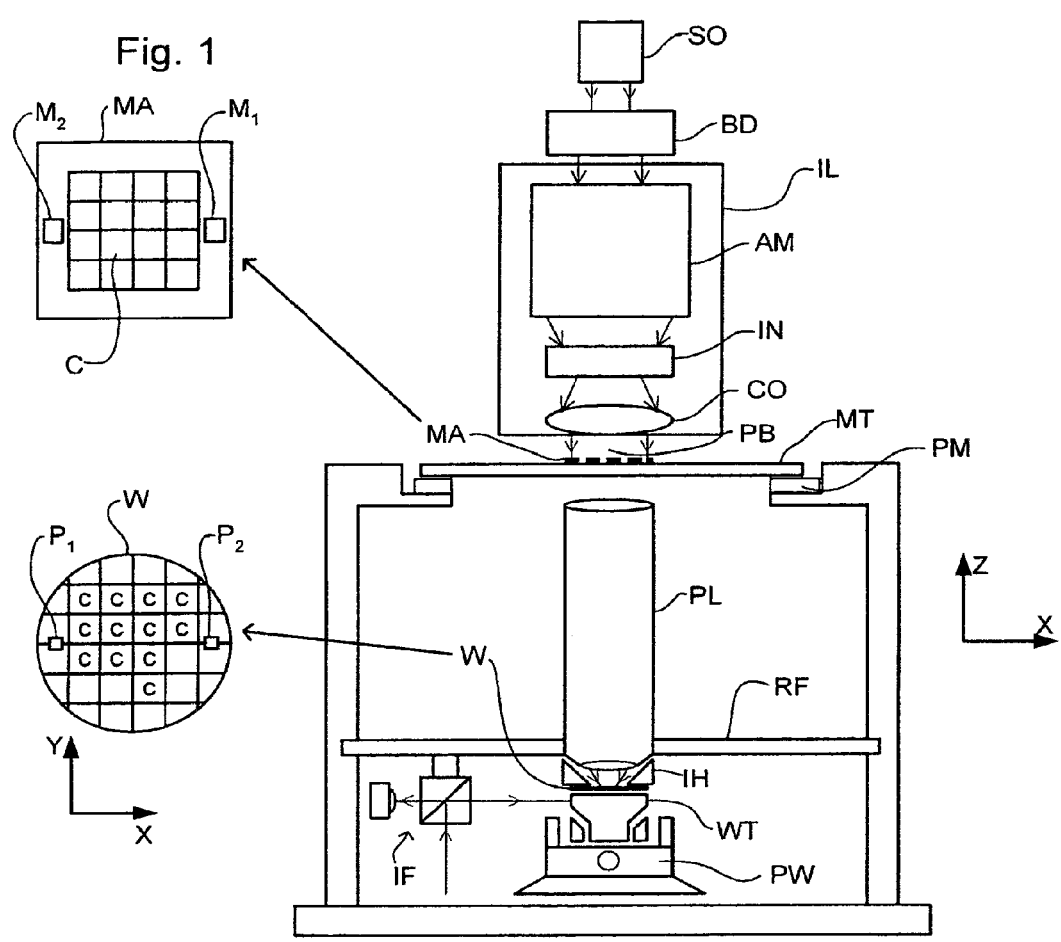
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL configured to condition a projection beam PB of radiation (e.g. UV radiation).

a first support structure (e.g. a mask table) MT configured to hold a patterning device (e.g. a mask) MA and connected to first positioner PM configured to accurately position the patterning device with respect to item PL;

a substrate table (e.g. a wafer table) WT configured to hold a substrate (e.g. a resist-coated wafer) W and connected to second positioner PW configured to accurately position the substrate with respect to item PL; and a projection system (e.g. a refractive projection lens) PL configured to image a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL supported by a frame RF, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2. Immersion lithography may be realized by an immersion hood IH, which provides or at least in part confines an immersion liquid to at least a portion of the substrate W.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion, in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Another immersion lithography solution with a localized liquid supply system solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference, and shown in FIG. 5.

Figure 5:
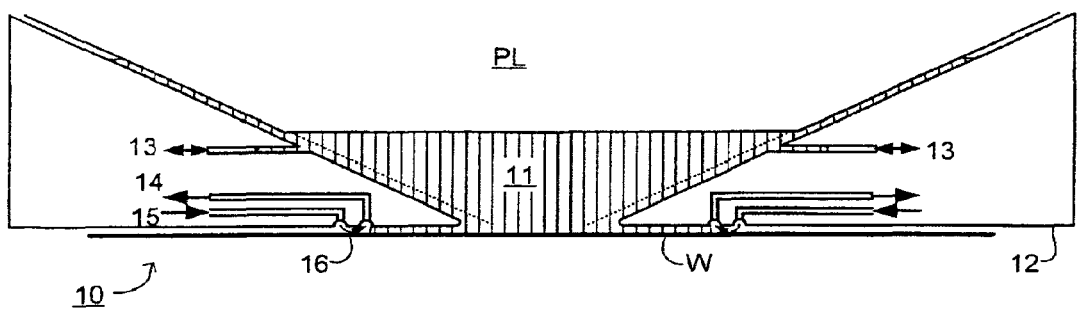
FIG. 5 depicts a liquid supply system according to an alternative embodiment of the invention.

FIG. 5 shows a liquid reservoir 10 between the projection system and the substrate stage according to an embodiment of the invention. The liquid reservoir 10 is filled with a liquid 11 having a relatively high refractive index, provided via inlet/outlet ducts 13. A liquid source containing the liquid is typically provided which is used to fill the reservoir via inlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

A liquid supply system for use in an embodiment of the present invention is also depicted in FIG. 5. The reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end closely conforms to the step of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air, synthetic air, $N_2$ or an inert gas, provided under pressure via inlet 15 to the gap between seal member 12 and substrate and extracted via outlet 14. The overpressure on the gas inlet 15, vacuum level on the outlet 14 and geometry of the gap are arranged so that there is a high-velocity gas flow inwards that confines the liquid.

The gas outlet system can also be used to remove the liquid from the system, thus acting as a liquid removal system. This is achieved by reducing the gas inlet pressure and allowing the liquid to be sucked out by the vacuum system, which can easily be arranged to handle the liquid, as well as the gas used to form the seal. In this way, the gas outlet system can be used to remove excess liquid from the substrate surface after exposure. The substrate W is taken out of the system and, as the substrate passes gas outlet 14, liquid is removed by the vacuum system.

Figure 2:
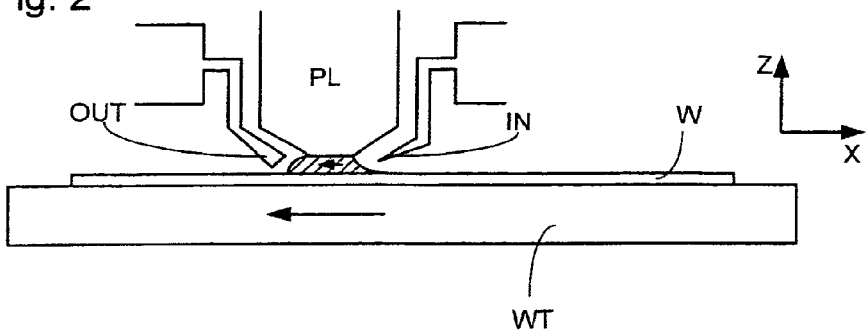
FIG. 2 depicts an example of a liquid supply system.
Figure 3:
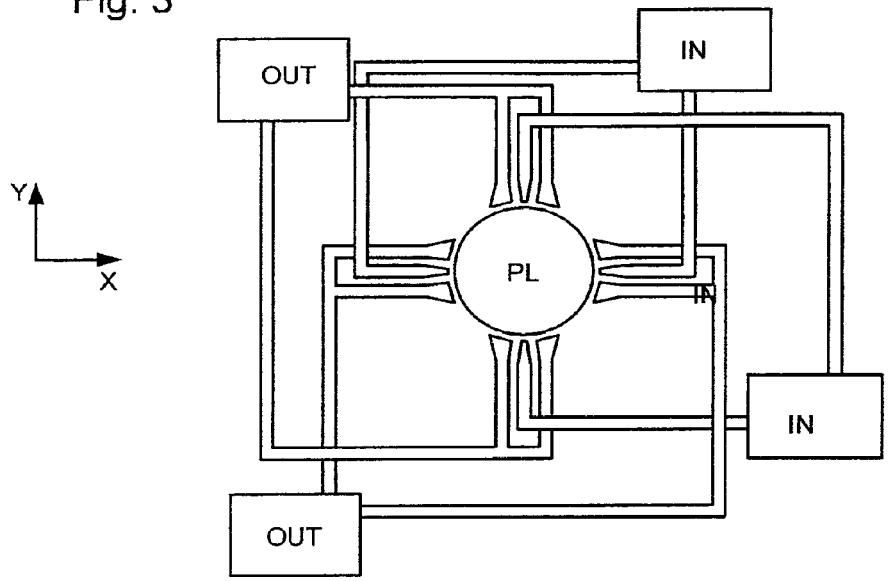
FIG. 3 depicts an example of the orientations of inlets and outlets of the liquid supply system of FIG. 2.
Figure 4:
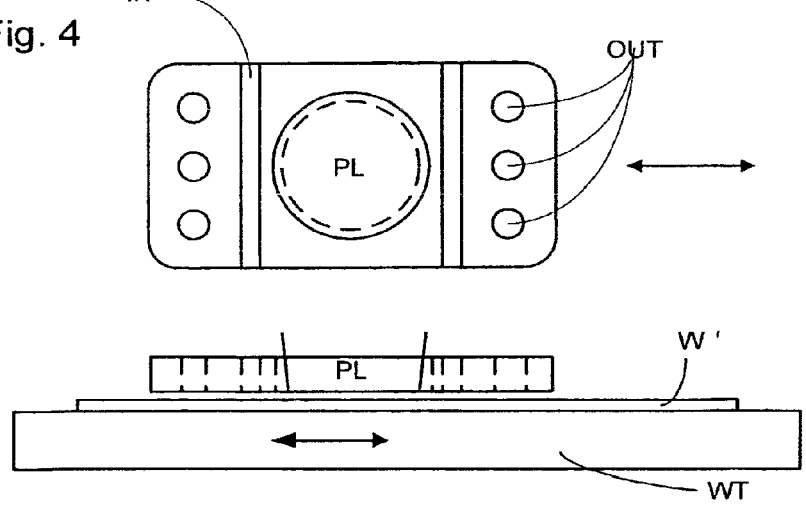
FIG. 4 depicts a liquid supply system according to an alternative embodiment of the invention.

FIGS. 2, 3 and 4 depict the liquid supply system of alternative embodiments of the invention. The details of these systems have been discussed further herein.

An immersion lithography apparatus typically comprises a liquid source containing the immersion liquid or at least one component (or ingredient) of the immersion liquid. For example, the liquid source may contain a concentrated solution of alkali halide (e.g. a concentration of greater than 2M, for example greater than 5M) or it may contain alkali halide in solid form. The concentrated solution or solid may be diluted or dissolved as described below before being introduced into reservoir 10. An immersion liquid means the liquid through which the patterned beam is projected onto the substrate and may be supplied between the projection system and the substrate or the projection system and the patterning means. The immersion liquid need not fully immerse the substrate or mask. For example, the immersion liquid may be provided to cover only a portion of a surface of the substrate, mask and/or projection system.

In an embodiment of the present invention, the immersion liquid is an aqueous solution comprising one or more alkali halides. The alkali halide(s) to be used in the solution are selected based, for example, on their refractive index, absorption properties and solubility in water. In particular, the refractive index of the alkali halide(s) should be greater than that of water. The approximate refractive indices of the alkali halides are set out in Table 1 below:

TABLE 1

|    | F    | Cl   | Br   | I    |
|----|------|------|------|------|
| Li | ~1.4 | >1.7 |      |      |
| Na | 1.35 | 1.63 | 1.84 | 2.1  |
| K  | ~1.4 | 1.56 | 1.73 | 2.03 |
| Rb |      | 1.59 |      | 1.9  |
| Cs |      |      | 1.88 | 2.1  |

In an embodiment, the immersion liquid has a refractive index of greater than 1.4, greater than 1.5 or greater than about 1.6. The nature and concentration of the alkali halide(s) can be altered in order to achieve the desired refractive index. Typical concentrations of the alkali halide are in the range of 0.01 to 2M, for example from 0.1 to 1M.

The alkali halide to be used is typically selected so that the immersion liquid has a low optical absorption at the wavelength of the projection beam. Typically, the alkali halide is one which has a low optical absorption at about 193 nm and/or 248 nm. However, where a different wavelength is used for the projection beam, the choice of alkali halide can be altered accordingly. Approximate room temperature absorption edge values (in nm) for the alkali halides are given in Table 2 below:

TABLE 2

|    | F   | Cl  | Br  | I   |
|----|-----|-----|-----|-----|
| Li | 105 | 168 | 194 | 248 |
| Na | 129 | 183 | 203 | 248 |
| K  | 138 | 180 | 200 | 232 |
| Rb | 144 | 185 | 207 | 243 |
| Cs | 151 | 188 | 203 | 241 |

It is advantageous to use an alkali halide that has a high solubility in water. Approximate values for the solubility of the alkali halides in cold water are given in Table 3 below (measured in g/100 cc):

TABLE 3

|    | F    | Cl   | Br  | I   |
|----|------|------|-----|-----|
| Li | 0.27 | 63.7 | 145 | 165 |
| Na | 4.22 | 35.7 | 116 | 184 |
| K  | 92   | 34   | 53  | 127 |
| Rb | 130  | 77   | 98  | 152 |
| Cs | 367  | 162  | 124 | 44  |

In an embodiment, in order to reduce or minimize the absorption of the immersion liquid at 193 nm and 248 nm, and to provide refractive indices in the desired range, selected alkali halide(s) include alkali metal chlorides, bromides and iodides, in particular the chlorides and iodides. Further, selected alkali halides include sodium, potassium, rubidium and cesium halides.

In an embodiment, the alkali halide used is a fluoride. This embodiment has the advantage that the lifetime of $CaF_2$ components immersed in the immersion liquid is increased by reducing the solubility of $CaF_2$ in the immersion liquid. In an embodiment, alkali metal fluorides NaF and CsF may be used. NaF has a particularly low adsorption at 193 nm and is therefore appropriate for use in 193 nm tools. CsF, however, is significantly more soluble in water and is thought to have a very high refractive index at 193 nm. Either material can therefore advantageously be employed.

By way of example, the following compares the solubility of $CaF_2$ in pure water and in a NaF solution.

The solubility constant Ksp for $CaF_2$ is 3.9e-11 $M^3$, where $Ksp=[Ca^{2+}]*[F^-]^2$. Therefore, in pure water:

$$Ksp=[Ca^{2+}]*[F^-]^2=[Ca^{2+}]*[2*Ca^{2+}]^2=4*[Ca^{2+}]^3=3.9\text{e-}11\ M^3$$

$$[Ca^{2+}]=2.1\text{e-}4\ M$$

i.e. at equilibrium, 2.1e-4 moles of $CaF_2$ will dissolve in a liter of water.

Similarly in a 0.01 M NaF solution:

$$Ksp=[Ca^{2+}]*[F^-]^2=[Ca^{2+}]*[2*Ca^{2+}+0.01\ M]^2=3.9\text{e-}11\ M^3$$

Since $[Ca^{2+}]$ will be much smaller than 0.01 M, $$[2*Ca^{2+}+0.01\ M]\sim[0.01\ M]$$

and $$Ksp=[Ca^{2+}]*[0.01\ M]^2=3.9\text{e-}11\ M^3$$

and $$[Ca^{2+}]=3.9\text{e-}7\ M$$

Thus, the solubility of $CaF_2$ is reduced by a factor of 1000 in 0.01M NaF compared to pure water. This demonstrates that a significant reduction in degradation of $CaF_2$ components will occur in 0.01M NaF compared to pure water.

In an embodiment, immersion liquids for use in immersion lithography are aqueous solutions of one or more alkali metal halides as described above, wherein the aqueous solution has one or more of the following properties:
(a) a content of organic compounds of 5 ppb or less or 1 ppb or less;
(b) a particle content of no more than 2 particles having a dimension of 50 nm or greater per ml of immersion liquid, or no more than 0.5 particles having a dimension of 50 nm or greater per ml of immersion liquid;
(c) a dissolved oxygen concentration of 15 ppb or less or 5 ppb or less; and
(d) a silica content of 500 ppt or less or 100 ppt or less.

In an embodiment, the aqueous solution has two or more or three or more, of the above properties. In an embodiment, the aqueous solution has a pH of from 5 to 8 or from 6 to 8. The aqueous solution in one embodiment has an alkali metal salt concentration of 0.01 to 2M. The aqueous solution may alternatively be a concentrated solution, adapted to be diluted prior to use as the immersion liquid. In this case, the aqueous solution typically has an alkali metal salt concentration of at least 2M, for example at least 5M.

Figure 6:
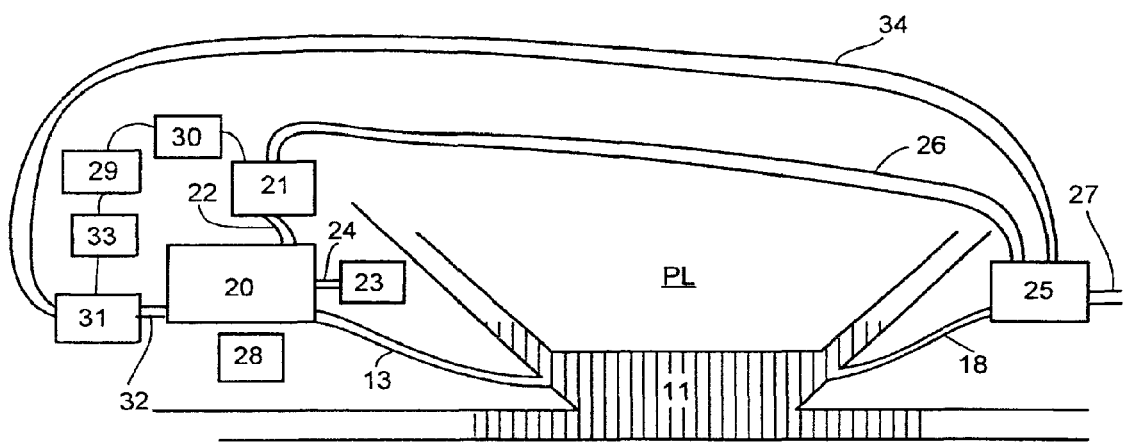
FIG. 6 depicts a liquid supply system according to a further alternative embodiment of the invention.

The aqueous solution may be prepared by using the apparatus depicted in FIG. 6. As can be seen, a concentrate feeder 21 stores a supply of the concentrate to be used. If appropriate, two or more concentrate feeders 21, 31 may be present to store supplies of two or more concentrates to be used. As described above one or more of the concentrates is, in an embodiment, an alkali halide but the concentrate(s) may be any dissolvable salt, dissolvable organic material or nano-particles which change the refractive index of the resulting solution. The concentrate(s) may alternatively be highly concentrated solution(s) comprising the alkali halide dissolvable salt, dissolvable organic material or nano-particles. In this case, the concentration of alkali halide dissolvable salt, dissolvable organic material or nano-particles in the concentrate is typically at least 2M. The concentrate from concentrate feeder 21 is fed to a fluid manifold 20 through inlet 22, while optional second concentrate from concentrate feeder 31 is fed to the fluid manifold through inlet 32. A solvent source 23 simultaneously supplies the fluid manifold 20 with a solvent through a tube 24. The solvent and the or each concentrate are mixed together in the fluid manifold to form a solution having the desired properties, e.g. viscosity and/or refractive index. The solution in the fluid manifold is continuously mixed using a mixer 28 to form a completely homogenous mixture. The mixer may be, for example, a magnet based mixing system in which a magnet is present in the fluid manifold and energization of an electromagnet causes the magnet to move around inside the fluid manifold. In an embodiment, the magnet should have a density similar to that of the solution to ensure that it moves around the whole of the fluid manifold 20, not just the top or bottom, to ensure that the whole mixture is equally mixed. Alternatively, a mechanical stirrer could be used. In an embodiment, the method for mixing the solution should avoid introducing gas (e.g., air) bubbles into the mixture as these could be transferred to the immersion liquid under the projection system causing errors in the exposure of substrate. By continuously mixing the solution, particle-particle interactions are not allowed to dominate and agglomeration of particles is avoided. The homogenous mixture is fed into a space 11 between the projection system and the substrate and the solution is removed from the space by outlet 18. Fresh solution is thus continuously supplied and removed from the space 11 and a build up of particles does not occur. The solution may be fed from outlet 18 to concentrate separator 25 which separates the or each concentrate from the solvent. The concentrate(s) can then be reused by feeding through tube 26 (and optionally tube 34) back to concentrate feeder 21 (and optionally concentrate feeder 31). The solvent, together with any impurities, can be removed through tube 27.

The amount of concentrate fed into the fluid manifold 20 from feeder 21 may be controlled by controller 30. Similarly, the amount of concentrate fed from feeder 31 may be controlled by controller 33. The amount of the or each concentrate introduced to fluid manifold 20 may be adjusted in order to alter the properties of the solution, e.g. viscosity and/or refractive index. Measuring device 29 may be used to determine one or more physical properties of the solution in fluid manifold 20, e.g. the concentration of one or more concentrates, refractive index and/or viscosity. The results of this measurement may be fed to controller 30 and optionally controller 33 to give continuous feedback regarding the properties of the solution. The concentration of the solution in the path of the projection beam affects the optical path length so the strength of the concentration could also be used as an additional projection system adjustment parameter. The viscosity and/or refractive index of the solution could also be adjusted similarly.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Embodiments of the present invention may be applied to any immersion lithography apparatus, in particular, but not exclusively, those types mentioned above.

In an embodiment, there is provided a lithographic apparatus, comprising: an illumination system configured to condition a beam of radiation; a support structure configured to hold a patterning device, the patterning device configured to impart the beam with a pattern in its cross-section; a substrate table configured to hold a substrate; a projection system configured to project the patterned beam onto a target portion of the substrate; and a liquid supply system configured to fill a space between the projection system and the substrate with a liquid, the liquid comprising an aqueous solution of one or more alkali metal halides.

In an embodiment, the liquid supply system comprises a liquid source containing the liquid or a component of the liquid. In an embodiment, the alkali metal halide is an alkali metal fluoride. In an embodiment, the alkali metal fluoride is NaF or CsF. In an embodiment, the alkali metal halide is an alkali metal chloride or bromide. In an embodiment, the alkali metal halide is a sodium, potassium, rubidium or cesium halide. In an embodiment, the liquid has a refractive index of 1.5 or more.

In an embodiment, there is provided use of one or more alkali metal halides as an, agent to increase the refractive index of a liquid which is water or an aqueous solution, wherein the liquid fills a space between a projection system and a substrate in a lithographic apparatus when in operation.

In an embodiment, there is provided use of an alkali metal fluoride as an agent to reduce degradation of, a $CaF_2$ part in a liquid, wherein the liquid fills a space between a projection system and a substrate in a lithographic apparatus when in operation.

In an embodiment, there is provided a device manufacturing method, comprising: providing a liquid comprising an aqueous solution of an alkali metal halide to a space between a projection system and a substrate; and projecting a patterned beam of radiation, using the projection system, through the liquid onto a target portion of the substrate.

In an embodiment, the alkali metal halide is an alkali metal fluoride. In an embodiment, the alkali metal halide is an alkali metal chloride or bromide. In an embodiment, the alkali metal halide is a sodium, potassium, rubidium or cesium halide. In an embodiment, the liquid has a refractive index of 1.5 or more.

In an embodiment, there is provided an aqueous solution of one or more alkali metal halides, the solution having one or more of the following properties: (a) a content of organic compounds of 5 ppb or less; (b) a particle content of no more than 2 particles having a dimension of 50 nm or greater per ml of the solution; (c) a dissolved oxygen concentration of 15 ppb or less; and (d) a silica content of 500 ppt or less.

In an embodiment, the one or more alkali metal halides is NaF or CsF. In an embodiment, the content of organic compounds is 1 ppb or less. In an embodiment, the particle content is no more than 0.5 particles having a dimension of 50 nm or greater per ml of the solution. In an embodiment, the dissolved oxygen concentration is 5 ppb or less. In an embodiment, the silica content is 100 ppt or less.

In an embodiment, there is provided a lithographic apparatus, comprising: an illumination system configured to condition a beam of radiation; a support structure configured to hold a patterning device, the patterning device configured to impart the beam with a pattern in its cross-section; a substrate table configured to hold a substrate; a projection system configured to project the patterned beam onto a target portion of the substrate; and a liquid supply system configured to fill a space between the projection system and the substrate with a liquid, the liquid supply system comprising a mixer configured to mixing a first component with a second component to form the liquid.

In an embodiment, the liquid supply system comprises a controller configured to control the amount of the first component, the second component, or both. In an embodiment, the liquid supply system comprises a measuring device configured to measure one or more properties of the liquid. In an embodiment, the first component is a solvent and the second component is a concentrate. In an embodiment, the concentrate comprises an alkali metal halide. In an embodiment, the apparatus further comprises a separator configured to separate the concentrate from the solvent. In an embodiment, the liquid supply system comprises a fluid chamber in which the liquid is continuously mixed. In an embodiment, the mixer comprises a magnet. In an embodiment, the mixer is configured to mix a solvent, a first concentrate and a second concentrate. In an embodiment, the first concentrate, the second concentrate, or both comprises an alkali metal halide. In an embodiment, the apparatus further comprises a separator configured to separate the first concentrate, the second concentrate, or both from the solvent.

In an embodiment, there is provided a device manufacturing method, comprising: continuously mixing a first component and a second component to form a liquid; providing the liquid to a space between a projection system and a substrate; and projecting a patterned beam of radiation, using the projection system, through the liquid onto a target portion of the substrate.

In an embodiment, the first component is a solvent and the second component is a concentrate. In an embodiment, the method further comprises controlling a physical property of the liquid by controlling an amount of the first component, the second component, or both used to form the liquid.

While specific embodiments of the invention have been described above, it will be appreciated that the invention may be practiced otherwise than as described. The description is not intended to limit the invention.

The invention claimed is:

1. A device manufacturing method, comprising:
   providing a lithographic apparatus, comprising a projection system and a liquid supply system to supply a liquid to a space between the projection system and a substrate, the liquid supply system including a mixer configured to mix at least a first component with a second component to form the liquid before supply to the space, a controller configured to control a physical property of the liquid by controlling the amount of the first and/or second component used to form the liquid, and a measuring device configured to measure a property of the liquid and to make feedback available to the controller;
   mixing using the mixer the first component and the second component to form the liquid;
   measuring a property of the liquid using the measuring device and making the feedback available to the controller;
   based on the feedback, controlling with the controller the physical property of the liquid by controlling the amount of the first and/or second component used to form the liquid;
   supplying the liquid to the space between the projection system and the substrate; and
   projecting a patterned beam of radiation, using the projection system, through the liquid onto a target portion of the substrate.

2. The method according to claim 1, wherein the second component is a solid or liquid.

3. The method according to claim 1, wherein the first component is a solvent and the second component is a concentrate.

4. The method according to claim 1, wherein measuring the property comprises measuring the physical property of the liquid.

5. The method according to claim 1, further comprising continuously mixing the liquid in a chamber during supply of the liquid to the space.

6. The method according to claim 1, wherein the mixing comprises mixing a solvent, the first component and the second component.

7. The method according to claim 1, wherein the physical property comprises one or more selected from: viscosity, refractive index or concentration of the liquid.

8. A lithographic apparatus, comprising:
   a table;
   a projection system to project a patterned beam onto a target portion of a substrate;
   a fluid supply system to supply a fluid comprising liquid to a space between the projection system and the table;
   a manifold to mix a first liquid component with a second component to form the fluid before supply to the space;
   a controller to control a physical property of the fluid by controlling the amount of the first and/or second component used to form the fluid; and
   a measuring device to measure a property of the fluid and to make feedback available to the controller,
   wherein the controller is configured to control the physical property of the fluid based on the feedback.

9. The apparatus according to claim 8, wherein the physical property comprises one or more selected from: viscosity, refractive index or concentration of the fluid.

10. The apparatus according to claim 8, wherein the measuring device is configured to measure the physical property of the fluid.

11. The apparatus according to claim 8, wherein the first component is a solvent and the second component is a concentrate.

12. The apparatus according to claim 8, comprising a chamber in which the fluid is continuously mixed during supply to the space.

13. The apparatus according to claim 8, wherein the projection system is configured to project a beam of radiation through the fluid.

14. A device manufacturing method, comprising:
providing a lithographic apparatus, comprising a projection system and a fluid supply system to supply a fluid comprising a liquid to a space between the projection system and a table, the lithographic apparatus including a manifold to mix at least a first liquid component with a second component to form the fluid before supply to the space, a controller configured to control a physical property of the fluid by controlling the amount of the first and/or second component used to form the fluid, and a measuring device configured to measure a property of the fluid and to make feedback available to the controller;
mixing in the manifold the first component and the second component to form the fluid;
measuring a property of the fluid using the measuring device and making the feedback available to the controller;
based on the feedback, controlling with the controller the physical property of the fluid by controlling the amount of the first and/or second component used to form the fluid; and
supplying the fluid to the space between the projection system and the table.

15. The method according to claim 14, wherein the physical property comprises one or more selected from: viscosity, refractive index or concentration of the fluid.

16. The method according to claim 14, wherein measuring the property comprises measuring the physical property of the fluid.

17. The method according to claim 14, wherein the first component is a solvent and the second component is a concentrate.

18. The method according to claim 14, further comprising continuously mixing the fluid in a chamber during supply of the fluid to the space.

19. The method according to claim 14, wherein the mixing comprises mixing a solvent, the first component and the second component.

20. The method according to claim 14, further comprising projecting a beam of radiation, using the projection system, through the fluid.

* * * * *